United States Patent
Gill

(10) Patent No.: US 7,633,724 B2
(45) Date of Patent: Dec. 15, 2009

(54) DUAL-TYPE TUNNELING MAGNETORESISTANCE (TMR) ELEMENTS

(75) Inventor: Hardayal S. Gill, Palo Alto, CA (US)

(73) Assignee: Hitachi Global Storage Technologies Netherlands, B.V., Amsterdam (NL)

(*) Notice: Subject to any disclaimer, the term of this patent is extended or adjusted under 35 U.S.C. 154(b) by 589 days.

(21) Appl. No.: 11/395,301

(22) Filed: Mar. 31, 2006

(65) Prior Publication Data

US 2007/0230068 A1    Oct. 4, 2007

(51) Int. Cl.
*G11B 5/39* (2006.01)
*G11B 5/127* (2006.01)

(52) U.S. Cl. .................... 360/324.2; 360/314

(58) Field of Classification Search .......... 360/314, 360/324.1, 324.11, 324.12, 324.2, 324
See application file for complete search history.

(56) References Cited

U.S. PATENT DOCUMENTS

| | | | |
|---|---|---|---|
| 6,219,208 B1* | 4/2001 | Gill | 360/324.1 |
| 6,271,997 B1* | 8/2001 | Gill | 360/314 |
| 6,452,763 B1 | 9/2002 | Gill | |
| 6,603,643 B2 | 8/2003 | Hoshiya et al. | |
| 6,643,915 B2* | 11/2003 | Gill | 29/603.14 |
| 6,693,776 B2* | 2/2004 | Gill | 360/324.12 |
| 6,741,432 B2* | 5/2004 | Pinarbasi | 360/324.11 |
| 6,798,626 B2 | 9/2004 | Hayashi et al. | |
| 7,038,889 B2* | 5/2006 | Freitag et al. | 360/314 |
| 7,295,408 B2* | 11/2007 | Saito et al. | 360/324.1 |
| 2003/0231426 A1 | 12/2003 | Sato | |
| 2004/0075953 A1* | 4/2004 | Gill | 360/314 |
| 2004/0264068 A1 | 12/2004 | Kanaya et al. | |
| 2005/0068684 A1* | 3/2005 | Gill | 360/314 |
| 2005/0078418 A1* | 4/2005 | Saito et al. | 360/324.2 |
| 2005/0213258 A1* | 9/2005 | Gill | 360/314 |
| 2005/0280958 A1* | 12/2005 | Saito et al. | 360/324.12 |

* cited by examiner

*Primary Examiner*—William J Klimowicz
(74) *Attorney, Agent, or Firm*—Duft Bornsen & Fishman, LLP

(57) ABSTRACT

Dual-type tunneling magnetoresistance (TMR) elements and associated methods of fabrication are disclosed that allow for higher bias voltages. In one embodiment, the dual-type TMR element includes a lower pinned layer structure, a lower tunnel barrier layer, a ferromagnetic free layer structure, an upper tunnel barrier layer, and an upper pinned layer structure. The lower pinned layer structure has a first Fermi level, while the upper pinned layer structure has a second Fermi level that is different than the first Fermi level of the lower pinned layer structure. By having different Fermi levels, the bias voltage induced in the TMR element may advantageously be increased without a significant reduction in TMR.

20 Claims, 5 Drawing Sheets

DUAL-TYPE TUNNELING MAGNETORESISTANCE (TMR) ELEMENTS

BACKGROUND OF THE INVENTION

1. Field of the Invention

The invention is related to the field of magnetoresistance (MR) elements and, in particular, to dual-type tunneling magnetoresistance (TMR) elements and associated methods of fabrication, where the pinned layer structures of the TMR elements include different materials so that the Fermi levels of the pinned layer structures are different.

2. Statement of the Problem

Many computer systems use magnetic disk drives for mass storage of information. Magnetic disk drives typically include one or more recording heads (sometimes referred to as sliders) that include read elements and write elements. A suspension arm holds the recording head above a magnetic disk. When the magnetic disk rotates, an air flow generated by the rotation of the magnetic disk causes an air bearing surface (ABS) side of the recording head to ride a particular height above the magnetic disk. The height depends on the shape of the ABS. As the recording head rides on the air bearing, an actuator moves an actuator arm that is connected to the suspension arm to position the read element and the write element over selected tracks of the magnetic disk.

To read data from the magnetic disk, transitions on a track of the magnetic disk create magnetic fields. As the read element passes over the transitions, the magnetic fields of the transitions modulate the resistance of the read element. The change in resistance of the read element is detected by passing a sense current through the read element, and then measuring the change in bias voltage across the read element. The resulting read back signal is used to recover the data encoded on the track of the magnetic disk.

The most common type of read elements are magnetoresistance (MR) read elements. One type of MR read element is a Giant MR (GMR) read element. GMR read elements using two layers of ferromagnetic material (e.g., CoFe) separated by a nonmagnetic spacer layer (e.g., Cu) are generally referred to as spin valve (SV) read elements. A simple-pinned SV read element generally includes an antiferromagnetic (AFM) pinning layer (e.g., PtMn), a ferromagnetic pinned layer (e.g., CoFe), a nonmagnetic spacer layer (e.g., Cu), and a ferromagnetic free layer (e.g., CoFe). The ferromagnetic pinned layer has its magnetization fixed by exchange coupling with the AFM pinning layer. The AFM pinning layer generally fixes the magnetic moment of the ferromagnetic pinned layer perpendicular to the ABS of the recording head. The magnetization of the ferromagnetic free layer is not fixed and is free to rotate in response to an external magnetic field from the magnetic disk.

Another type of SV read element is an antiparallel pinned (AP) SV read element. The AP-pinned SV read element differs from the simple pinned SV read element in that an AP-pinned structure has multiple thin film layers forming the pinned layer structure instead of a single pinned layer. The pinned layer structure includes a first ferromagnetic pinned layer (e.g., CoFe), a nonmagnetic spacer layer (e.g., Ru), and a second ferromagnetic pinned layer (e.g., CoFe). The first ferromagnetic pinned layer has a magnetization oriented in a first direction perpendicular to the ABS by exchange coupling with the AFM pinning layer. The second ferromagnetic pinned layer is antiparallel exchange coupled with the first ferromagnetic pinned layer across the spacer layer. Accordingly, the magnetization of the second ferromagnetic pinned layer is oriented in a second direction that is antiparallel to the direction of the magnetization of the first ferromagnetic pinned layer.

Another type of MR read element is a Tunneling MR (TMR) read element. TMR read elements differ from GMR elements in that a thin, electrically insulating, tunnel barrier layer (e.g., aluminum oxide or magnesium oxide) is used between the ferromagnetic pinned layer and the ferromagnetic free layer instead of a nonmagnetic spacer layer (e.g., Cu). The TMR read elements may be simple pinned or AP-pinned as with the GMR read elements.

GMR read elements and TMR read elements may be current in plane (CIP) read elements or current perpendicular to the planes (CPP) read elements. Read elements have first and second leads for conducting a sense current through the read element. If the sense current is applied parallel to the major planes of the layers of the read element, then the read element is termed a CIP read element. If the sense current is applied perpendicular to the major planes of the layers of the read element, then the read element is termed a CPP read element.

The above GMR and TMR read elements may be referred to as single-type GMR read elements and single-type TMR read elements. To improve the performance of the read elements, some recording head manufacturers are developing dual-type GMR read elements and dual-type TMR read elements. A dual-type TMR read element, for example, includes two tunnel barrier layers on either side of the ferromagnetic free layer. The dual-type TMR read element also includes two ferromagnetic pinned layers, with one ferromagnetic pinned layer adjacent to each of the tunnel barrier layers. Dual-type TMR read elements and dual-type GMR read elements have the effect of increasing the rate of resistance change in the element as compared to single-type elements, which allows the dual-type elements to be more sensitive to external magnetic fields.

FIG. 1 illustrates a typical dual-type TMR read element 100. FIG. 1 is a view from the-air-bearing surface (ABS) of TMR read element 100. TMR read element 100 includes a TMR read sensor 110 sandwiched between a first shield 131 and a second shield 132. TMR read sensor 110 is a TMR read sensor used in a current-perpendicular-to-plane (CPP) mode.

TMR read sensor 110 includes a nonmagnetic seed layer 111 (e.g., Ta), an antiferromagnetic (AFM) lower pinning layer 112 (e.g., PtMn), a ferromagnetic CoFe lower pinned (keeper) layer 113, a nonmagnetic Ru spacer layer 114, a ferromagnetic CoFe lower pinned (reference) layer 115, a tunnel barrier layer 116, and a ferromagnetic CoFe free layer 117. TMR read sensor 110 also includes a tunnel barrier layer 118, a ferromagnetic CoFe upper pinned (reference) layer 119, a nonmagnetic Ru spacer layer 120, a ferromagnetic CoFe upper pinned (keeper) layer 121, an AFM upper pinning layer 122, and a nonmagnetic Ta cap layer 123. Traditionally, the lower portion of TMR read sensor 110 and the upper portion of TMR read sensor 110 (below and above free layer 117) are mirror images of each other in terms of materials used, layer or film thicknesses, etc.

When in operation, a sense current is passed through TMR read sensor 110 in a CPP fashion. The sense current and the resistance of TMR read sensor 110 generates a bias voltage. The change in bias voltage is used to generate a read back signal that shows the data stored on a magnetic disk. One characteristic of TMR read element 100 of FIG. 1 is that the TMR of TMR read element 100 and bias voltage are related such that TMR decreases as the bias voltage increases. This characteristic is due to the band structure of the materials used to form TMR read sensor 110.

FIG. 2 is a graph illustrating TMR versus bias voltage. The graph in FIG. 2 illustrates the TMR response of TMR read sensor 110. If a negative bias voltage is induced in TMR read element 100, then TMR drops as the negative bias voltage increases. Similarly, if a positive bias voltage is induced in TMR read element 100, then TMR drops as the positive bias voltage increases. For instance, at positive bias voltage $V_1$, the TMR of TMR read sensor 110 is still relatively high but voltage $V_1$ may be lower than desired. At positive bias voltage $V_2$, the voltage $V_2$ may be a desirable voltage, but TMR of TMR read sensor 110 has drop significantly. Unfortunately, the characteristic of decreasing TMR with increasing bias voltage is a limiting factor for performance and reliability of TMR read elements.

SUMMARY OF THE SOLUTION

The invention solves the above and other related problems with an improved dual-type TMR element that allows for increased bias voltages to be used without a significant reduction in TMR. By allowing for increased bias voltages, the read back signal from the TMR element has a higher amplitude and consequently a higher signal-to-noise ratio. The larger, clearer read back signal advantageously provides for enhanced performance and reliability of the TMR element, which allows for higher density applications.

In one embodiment, the dual-type TMR element includes a lower pinned layer structure, a lower tunnel barrier layer, a ferromagnetic free layer structure, an upper tunnel barrier layer, and an upper pinned layer structure. According to features and aspects herein, the lower pinned layer structure has a first Fermi level, while the upper pinned layer structure has a second Fermi level that is different than the first Fermi level of the lower pinned layer structure. By having different Fermi levels, the bias voltage induced in the TMR element may advantageously be increased without a significant reduction in TMR.

The Fermi levels of the lower pinned layer structure and the upper pinned layer structure are determined by the materials used to form the pinned layer structures. For instance, the lower pinned layer structure may be formed from Ni or another material with a similar Fermi energy. The upper pinned layer structure may be formed from Fe or another material with a similar Fermi energy. The Fermi energy of the materials used in the lower pinned layer structure is different (e.g., greater than or less than) than the Fermi energy of the materials used in the upper pinned layer structure. Thus, the Fermi levels of the pinned layer structures are different.

Other exemplary embodiments comprise methods of fabricating dual-type TMR elements described herein.

The invention may include other exemplary embodiments described below.

DESCRIPTION OF THE DRAWINGS

The same reference number represents the same element on all drawings.

DETAILED DESCRIPTION OF THE INVENTION

FIGS. 3-8 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 3:
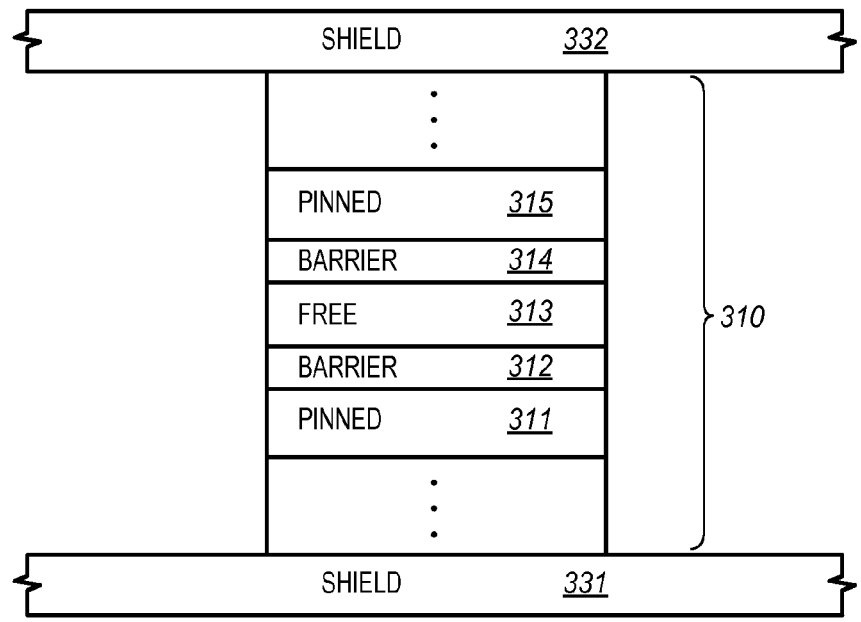
FIG. 3 illustrates a dual-type TMR element in an exemplary embodiment of the invention.

FIG. 3 illustrates a dual-type TMR element 300 in an exemplary embodiment of the invention. FIG. 3 is a view from the air bearing surface (ABS) of TMR element 300. Exemplary layers of TMR element 300 are shown. Those skilled in the art understand that TMR element 300 may include other layers in other exemplary embodiments. TMR element 300 may be used in a magnetic disk drive system or in other magnetic applications.

In FIG. 3, TMR element 300 includes a TMR sensor 310 sandwiched between a first shield 331 and a second shield 332. TMR sensor 310 includes at least a ferromagnetic lower pinned layer structure 311, a lower tunnel barrier layer 312, a ferromagnetic free layer structure 313, an upper tunnel barrier layer 314, and a ferromagnetic upper pinned layer structure 315. There may be other layers to TMR sensor 310 that are indicated by empty boxes. TMR element 300 may include a CPP TMR element.

According to features and aspects herein, lower pinned layer structure 311 has a first Fermi level and upper pinned layer structure 315 has a second Fermi level, where the Fermi levels of the two pinned layer structures are different. The Fermi level of lower pinned layer structure 311 and upper pinned layer structure 315 is a term used to describe the top of the collection of electron energy levels at absolute zero. The Fermi level is a function of the Fermi energy of the materials used in lower pinned layer structure 311 and upper pinned layer structure 315. Lower pinned layer structure 311 and upper pinned layer structure 315 may be formed from different materials, different dopants, and/or different material/dopant ratios that cause the Fermi levels of the pinned layer structures 311, 315 to be different. By having different Fermi levels in lower pinned layer structure 311 and upper pinned layer structure 315, the bias voltage induced in TMR element 300 may advantageously be increased without a significant reduction in TMR.

Figure 1:
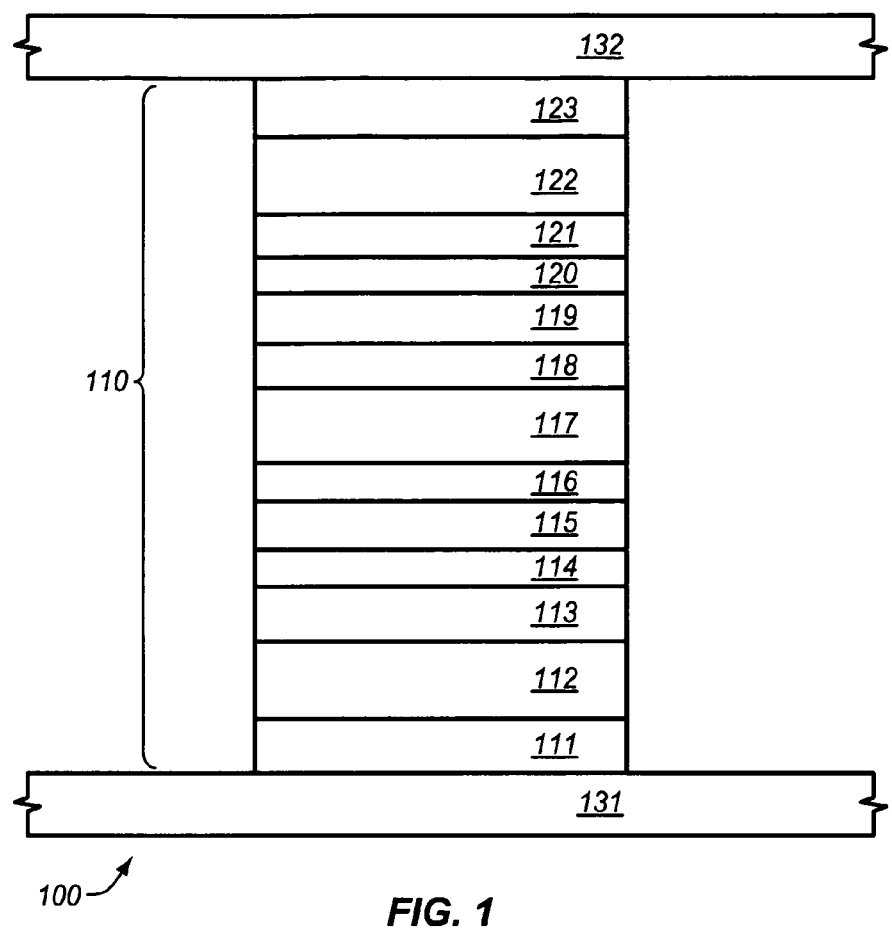
FIG. 1 illustrates a typical dual-type TMR read element in the prior art.
Figure 2:
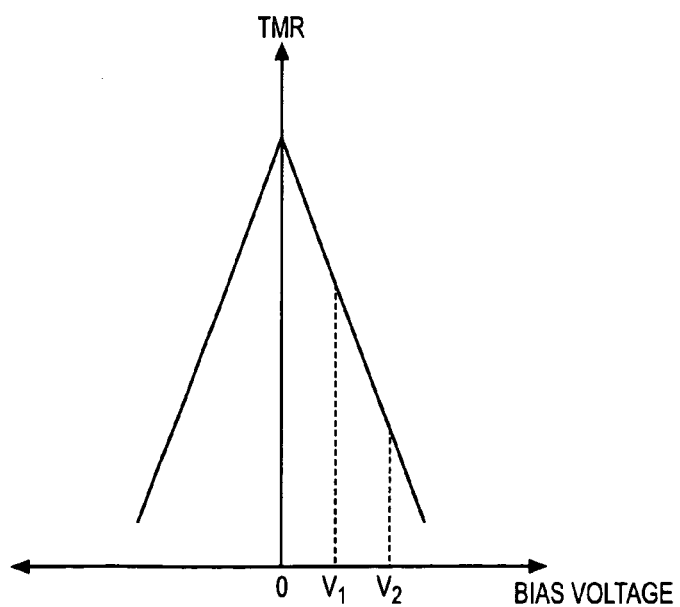
FIG. 2 is a graph illustrating TMR versus bias voltage in a TMR read sensor in the prior art.
Figure 4:
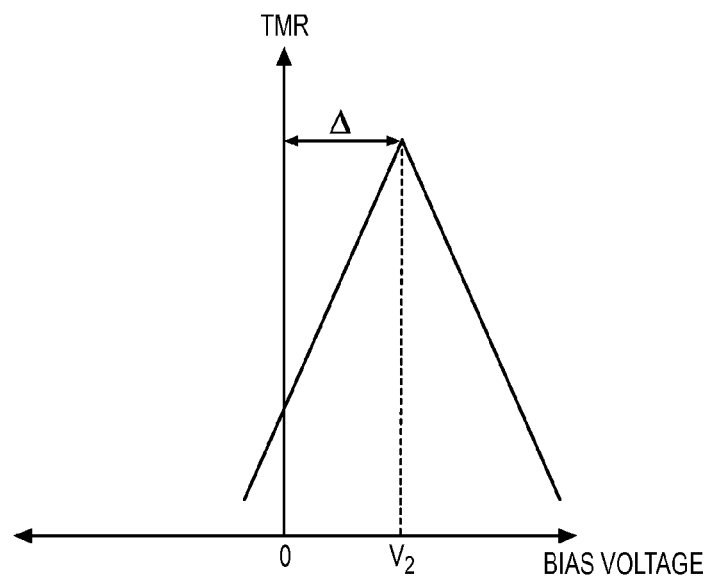
FIG. 4 is a graph illustrating TMR versus bias voltage in a TMR sensor in an exemplary embodiment.

FIG. 4 is a graph illustrating TMR versus bias voltage in TMR sensor 310 in an exemplary embodiment. The graph in FIG. 4 illustrates the TMR response of TMR sensor 310. Due to the different Fermi levels of the pinned layer structures 311, 315, the TMR response of TMR sensor 310 as shown in FIG. 4 is offset as compared to the TMR response shown in FIG. 2. The TMR response of TMR sensor 310 is offset by Δ. Thus, higher bias voltages may be induced without degrading TMR in TMR sensor 310. For instance, if a positive bias voltage $V_2$ is induced in TMR sensor 310, then the TMR of TMR sensor 310 is still very high. As the positive bias voltage is increased above voltage $V_2$, the TMR begins to drop. However, a higher bias voltage may advantageously be induced without a significant or any drop in TMR due to the offset of the TMR response.

Figure 5:
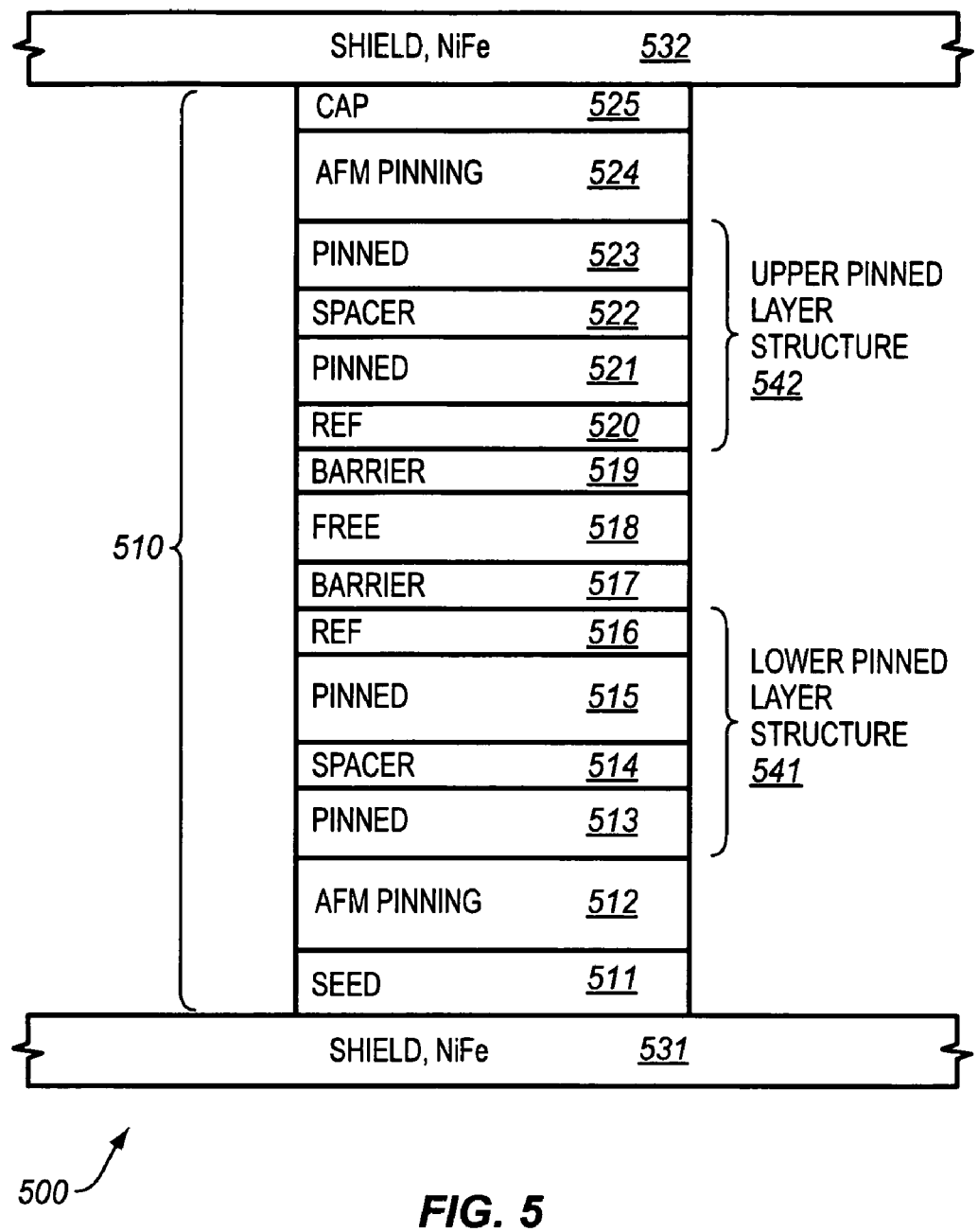
FIG. 5 illustrates another dual-type TMR element in an exemplary embodiment.
Figure 6:
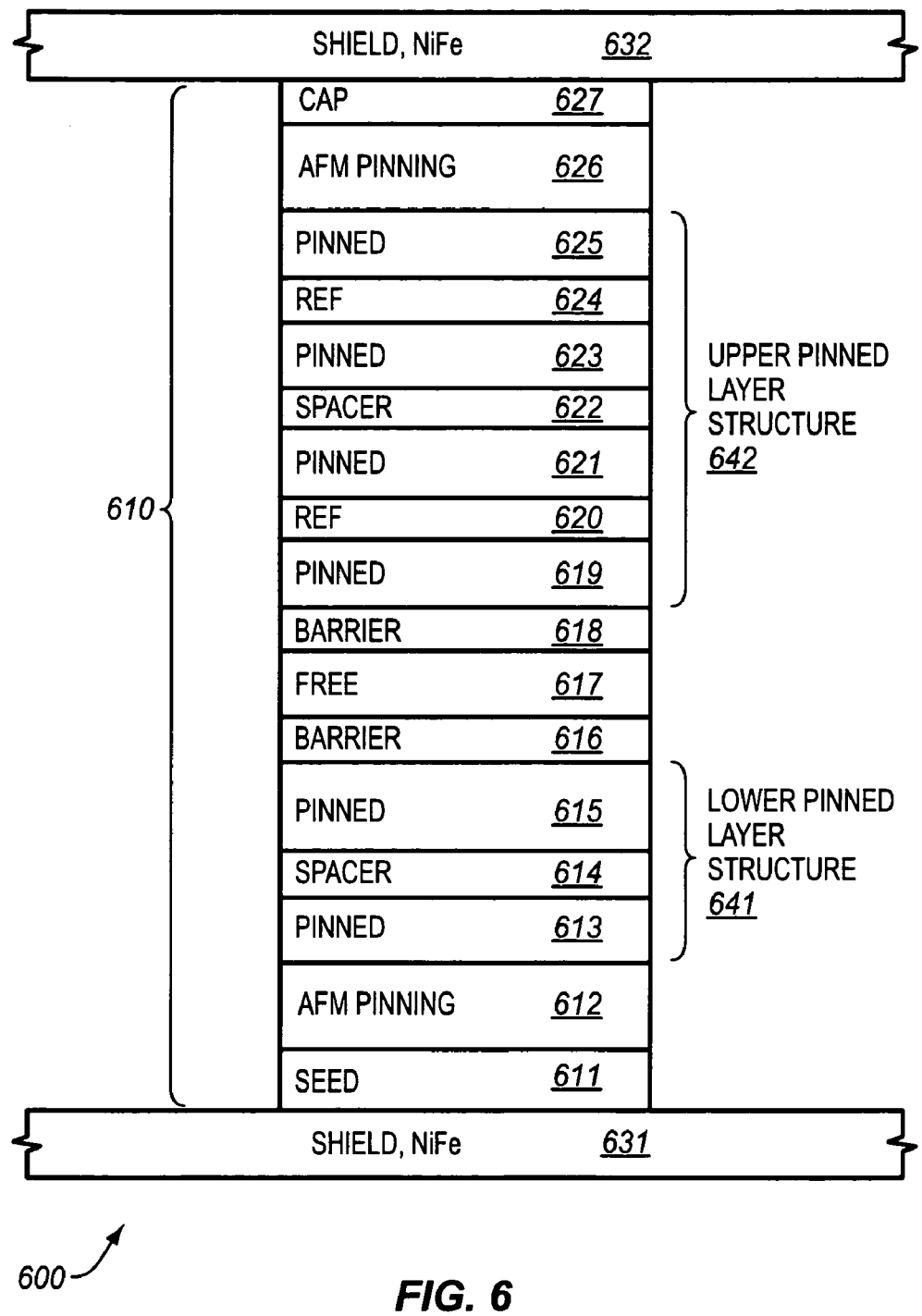
FIG. 6 illustrates another dual-type TMR element in an exemplary embodiment.

TMR elements according to the invention may have many different configurations in order to provide lower pinned layer structure 311 having a different Fermi level than upper pinned layer structure 315. FIGS. 5-6 illustrate two possible embodiments although many more embodiments may exist.

FIG. 5 illustrates another dual-type TMR element 500 in an exemplary embodiment. FIG. 5 is a view from the air bearing surface (ABS) of TMR element 500. TMR element 500 is a detailed embodiment that is in no way intended to limit the scope of the invention, as exemplary layers of TMR element 500 are shown. Those skilled in the art understand that TMR element 500 may include other layers in other exemplary embodiments. TMR element 500 may be used in a magnetic disk drive system or in other magnetic applications.

In FIG. 5, TMR element 500 includes a TMR sensor 510 sandwiched between a first shield 531 and a second shield 532. The first shield 531 and the second shield 532 may be formed from NiFe or a similar material. The lower portion of TMR sensor 510 (the portion below the free layer), includes one or more seed layers 511 (e.g., Ta, NiFeCr, or NiFe), an antiferromagnetic (AFM) lower pinning layer 512 (e.g., IrMnCr or PtMn), and a lower pinned layer structure 541. Lower pinned layer structure 541 includes a ferromagnetic lower pinned (keeper) layer 513 (e.g., CoFe), a nonmagnetic lower spacer layer 514 (e.g., Ru), a ferromagnetic lower pinned (reference) layer 515, and a ferromagnetic lower reference layer 516. TMR sensor 510 also includes a lower tunnel barrier layer 517 (e.g., aluminum oxide or magnesium oxide), a ferromagnetic free layer 518 formed from materials such as CoFe or CoFe/NiFe/CoFe, and an upper tunnel barrier layer 519. The upper portion of TMR sensor 510 (the portion above the free layer) includes an upper pinned layer structure 542, an AFM upper pinning layer 524 (e.g., IrMnCr or PtMn), and cap layer 525. Upper pinned layer structure 542 includes a ferromagnetic upper reference layer 520, a ferromagnetic upper pinned (reference) layer 521 (e.g., CoFe), a nonmagnetic spacer layer 522 (e.g., Ru), and a ferromagnetic upper pinned (keeper) layer 523 (e.g., CoFe). The materials given for the layers of TMR sensor 510 are just examples and other materials may be used.

TMR element 500 differs from prior dual-type TMR elements in that it includes lower reference layer 516 in lower pinned layer structure 541, and includes upper reference layer 520 in upper pinned layer structure 542. In this embodiment, lower reference layer 516 is formed from a material that has a first Fermi energy, while upper reference layer 520 is formed from a material having a second Fermi energy. The first Fermi energy of lower reference layer 516 is different (i.e., higher or lower) than the second Fermi energy of upper reference layer 520.

For instance, lower reference layer 516 may comprise a layer of Fe or a Fe alloy while upper reference layer 520 may comprise a layer of Ni or a Ni alloy. Fe has Fermi energy (Ef) of about 10 eV while Ni has Fermi energy of about 8 eV. The 2 eV difference between the Fermi energies of Fe and Ni provides the offset of the TMR response as shown in FIG. 4. In another example, lower reference layer 516 may comprise a layer of Fe or a Fe alloy while upper reference layer 520 may comprise a layer of Co or a Co alloy. Fe has Fermi energy of about 10 eV while Co has Fermi energy of about 9 eV. The 1 eV difference between the Fermi energies of Fe and Co provides the offset of the TMR response as shown in FIG. 4. In another example, lower reference layer 516 may comprise a layer of Co or a Co alloy while upper reference layer 520 may comprise a layer of Ni or a Ni alloy. A Fermi energy difference of about 1 eV or more should provide an offset as in FIG. 4 that provides improved performance.

FIG. 6 illustrates another dual-type TMR element 600 in an exemplary embodiment. FIG. 6 is a view from the air bearing surface (ABS) of TMR element 600. TMR element 600 is a detailed embodiment that is in no way intended to limit the scope of the invention, as exemplary layers of TMR element 600 are shown. Those skilled in the art understand that TMR element 600 may include other layers in other exemplary embodiments. TMR element 600 may be used in a magnetic disk drive system or in other magnetic applications.

In FIG. 6, TMR element 600 includes a TMR sensor 610 sandwiched between a first shield 631 and a second shield 632. The first shield 631 and the second shield 632 may be formed from NiFe or a similar material. The lower portion of TMR sensor 610 (the portion below the free layer), includes one or more seed layers 611 (e.g., Ta, NiFeCr, or NiFe), an antiferromagnetic (AFM) lower pinning layer 612 (e.g., IrMnCr or PtMn), and a lower pinned layer structure 641. Lower pinned layer structure 641 includes a ferromagnetic lower pinned (keeper) layer 613 (e.g., CoFe), a nonmagnetic lower spacer layer 614 (e.g., Ru), and a ferromagnetic lower pinned (reference) layer 615. TMR sensor 610 also includes a lower tunnel barrier layer 616 (e.g., aluminum oxide or magnesium oxide), a ferromagnetic free layer 617 formed from materials such as CoFe or CoFe/NiFe/CoFe, and an upper tunnel barrier layer 618. The upper portion of TMR sensor 610 (the portion above the free layer) includes an upper pinned layer structure 642, an AFM upper pinning layer 626 (e.g., IrMnCr or PtMn), and a cap layer 627. Upper pinned layer structure 642 includes a first ferromagnetic upper pinned (reference) layer 619 (e.g., CoFe), a first ferromagnetic upper reference layer 620, a second ferromagnetic upper pinned (reference) layer 621, a nonmagnetic spacer layer 622 (e.g., Ru), a first ferromagnetic upper pinned (keeper) layer 623 (e.g., CoFe), a second upper reference layer 624, and a second ferromagnetic upper pinned (keeper) layer 625. The materials given for the layers of TMR sensor 610 are just examples and other materials may be used.

TMR element 600 differs from prior dual-type TMR elements in that it includes two upper reference layers 620 and 624 in upper pinned layer structure 642. In this embodiment, upper reference layers 620 and 624 are formed from a material that has a Fermi energy different (i.e., higher or lower) that the Fermi energy of the materials used to form lower pinned layer structure 641. For instance, the upper reference layers 620 and 624 may be formed from Ni so that upper pinned layer structure 642 has a high presence of Ni. At the same time, lower pinned layer structure 641 is comprised of ferromagnetic layers of CoFe. Upper pinned layer structure 642 having the high presence of Ni has a higher Fermi level or higher Fermi energy than lower pinned layer structure 641 due to the presence of the Ni layers.

Figure 7:
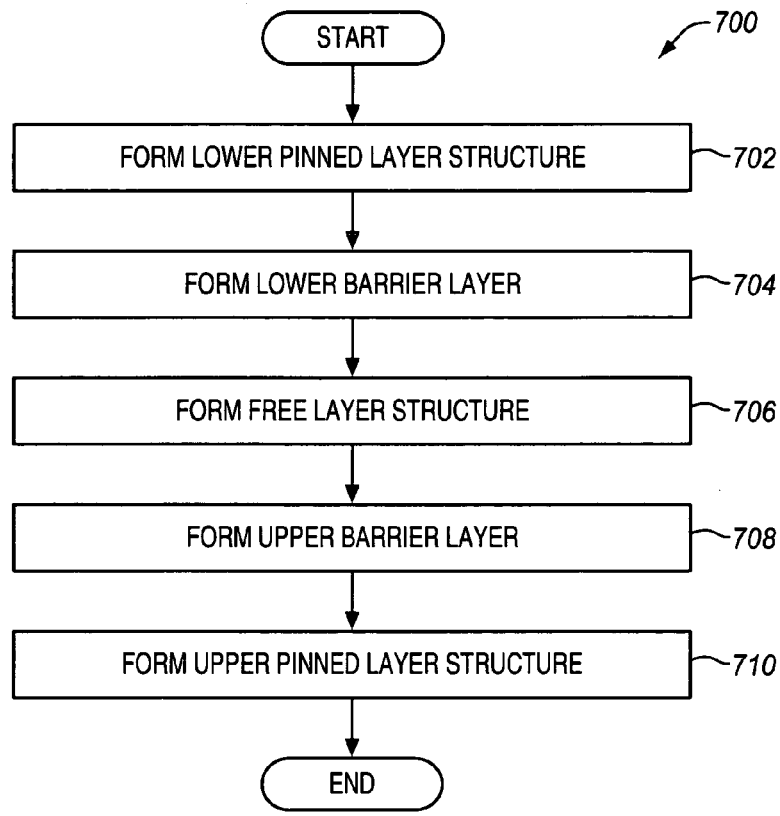
FIG. 7 is a flow chart illustrating a method of fabricating dual-type TMR elements in an exemplary embodiment.

FIG. 7 is a flow chart illustrating a method 700 of fabricating dual-type TMR elements in an exemplary embodiment. Method 700 may be used to form the TMR elements shown in FIG. 3, 5, and 6. The steps of the flow chart in FIG. 7 are not all inclusive and may include other steps not shown.

TMR elements may be fabricated in a magnetron sputtering, an ion beam sputtering system, or another system to sequentially deposit the multilayer structure, such as TMR elements shown in FIGS. 3, 5, and 6. A first shield is formed or deposited on a substrate. The first shield may be formed with a material such as NiFe. One or more other layers may then be deposited on the first shield. For instance, a seed layer and an AFM lower pinning layer may be sequentially deposited as is shown in FIGS. 5-6.

According to method 700, a lower pinned layer structure is formed in step 702. The lower pinned layer structure may be formed in many different ways. In one embodiment, step 702 may include forming a single ferromagnetic lower pinned layer, such as a layer of CoFe. In another embodiment, step 702 may include forming a lower pinned (keeper) layer (e.g., CoFe), forming a nonmagnetic spacer layer (e.g., Ru), forming a lower pinned (reference) layer, and forming a lower reference layer (e.g., Ni, Fe, Co) (see FIG. 5). In another embodiment, step 702 may include forming a lower pinned (keeper) layer (e.g., CoFe), forming a nonmagnetic spacer layer (e.g., Ru), and forming a lower pinned (reference) layer (see FIG. 6).

In step 704, a lower tunnel barrier layer is formed. The tunnel barrier layer may comprise a layer of aluminum oxide, magnesium oxide, etc, that may be formed in any desired manner. In step 706, a ferromagnetic free layer structure is formed. The ferromagnetic free layer structure may be formed in many different ways. In one embodiment, step 706 may include forming a single ferromagnetic free layer, such as a layer of CoFe. In another embodiment, step 706 may include forming a multi-layer free layer comprising a CoFe free layer, a NiFe free layer, and a CoFe free layer. In step 708, an upper tunnel barrier layer is formed.

In step 710, an upper pinned layer structure is formed. The upper pinned layer structure may be formed in many different ways. In one embodiment, step 710 may include forming a single ferromagnetic upper pinned layer, such as a layer of NiFe. In another embodiment, step 710 may include forming an upper reference layer (e.g., Ni), forming an upper pinned (reference) layer (e.g., NiFe), forming a nonmagnetic spacer layer (e.g., Ru), and forming an upper pinned (keeper) layer (e.g., NiFe) (see FIG. 5). In another embodiment, step 710 may include forming a first upper pinned (reference) layer (e.g., CoFe), forming a first upper reference layer (e.g., Ni, Fe, Co), and forming a second upper pinned (reference) layer. Step 710 would further include forming a nonmagnetic spacer layer (e.g., Ru), and forming a first upper pinned (keeper) layer (e.g., CoFe), forming a second upper reference layer (e.g., Ni), and forming a second upper pinned (keeper) layer (see FIG. 6).

After forming these and possibly other layers, the TMR element may be annealed, lapped, or otherwise processed.

According to features and aspects herein, the lower pinned layer structure has a first Fermi level and the upper pinned layer structure has a second Fermi level, where the Fermi levels of the two pinned layer structures are different. The Fermi level is a function of the Fermi energy of the materials used in the lower pinned layer structure and the upper pinned layer structure. The lower pinned layer structure and the upper pinned layer structure may be formed from different materials, different dopants, and/or different material/dopant ratios that cause the Fermi levels of the pinned layer structures to be different. By having different Fermi levels in the lower pinned layer structure and the upper pinned layer structure, the bias voltage induced in the TMR element may advantageously be increased without a significant reduction in TMR.

The dual-type TMR elements described above may be implemented in a magnetic disk drive system. The TMR elements may also be implemented in memories or other magnetic applications.

Figure 8:
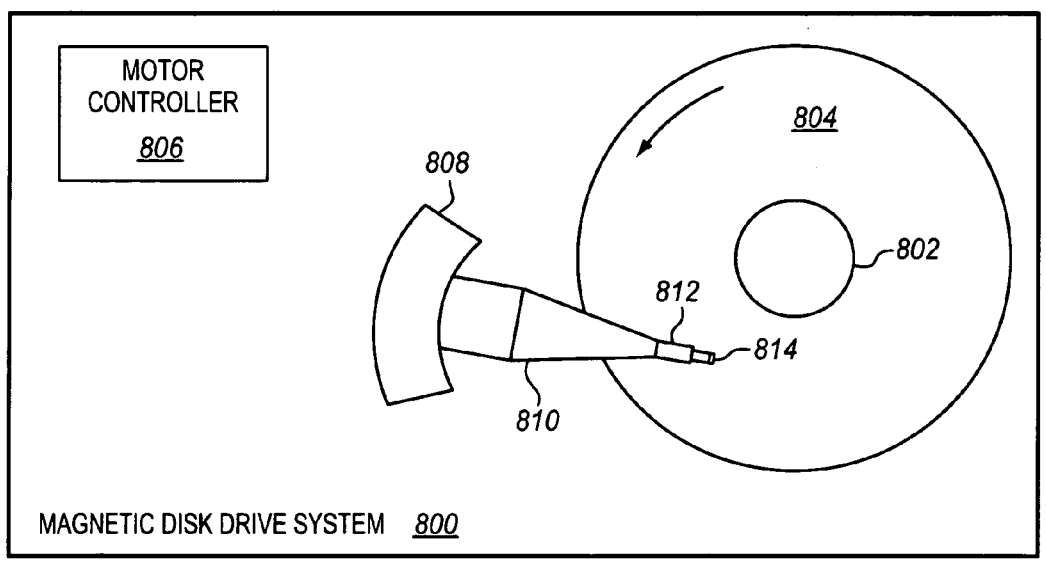
FIG. 8 illustrates a magnetic disk drive system in an exemplary embodiment.

FIG. 8 illustrates a magnetic disk drive system 800 in an exemplary embodiment. Magnetic disk drive system 800 includes a spindle 802, a magnetic recording medium 804, a motor controller 806, an actuator 808, an actuator arm 810, a suspension arm 812, and a recording head 814. Spindle 802 supports and rotates magnetic recording medium 804 in the direction indicated by the arrow. A spindle motor (not shown) rotates spindle 802 according to control signals from motor controller 806. Recording head 814 is supported by suspension arm 812 and actuator arm 810. Actuator arm 810 is connected to actuator 808 that is configured to rotate in order to position recording head 814 over a desired track of magnetic recording medium 804. Magnetic disk drive system 800 may include other devices, components, or systems not shown in FIG. 8. For instance, a plurality of magnetic disks, actuators, actuator arms, suspension arms, and recording heads may be used.

When magnetic recording medium 804 rotates, an air flow generated by the rotation of magnetic disk 804 causes an air bearing surface (ABS) of recording head 814 to ride on a cushion of air at a particular height above magnetic disk 804. The height depends on the shape of the ABS. As recording head 814 rides on the cushion of air, actuator 808 moves actuator arm 810 to position a read element (not shown) and a write element (not shown) in recording head 814 over selected tracks of magnetic recording medium 804. The read element in recording head 814 may comprise a dual-type TMR element as described above.

Although specific embodiments were described herein, the scope of the invention is not limited to those specific embodiments. The scope of the invention is defined by the following claims and any equivalents thereof.

I claim:

1. A tunneling magnetoresistance (TMR) element comprising:
    a lower pinned layer structure having a first Fermi level;
    a lower barrier layer;
    a free layer structure;
    an upper barrier layer; and
    an upper pinned layer structure having a second Fermi level different than the first Fermi level of the lower pinned layer structure;
    wherein the upper pinned layer structure includes:
        a first ferromagnetic upper pinned reference layer formed from an alloy;
        a first ferromagnetic upper reference layer formed from a pure metal;
        a second ferromagnetic upper pinned reference layer;
        a nonmagnetic spacer layer;
        a first ferromagnetic upper pinned keeper layer;
        a second upper reference layer; and
        a second ferromagnetic upper pinned keeper layer.

2. The TMR element of claim 1 wherein:
    the lower pinned layer structure includes:
        a ferromagnetic lower pinned keeper layer;
        a nonmagnetic lower spacer layer; and
        a ferromagnetic lower pinned reference layer.

3. The TMR element of claim 1 wherein the difference between the first Fermi energy of the lower pinned layer structure and the second Fermi energy of the upper pinned layer structure is at least 1 eV.

4. The TMR element of claim 1 wherein:
    the first ferromagnetic upper pinned reference layer comprises a layer of a Ni alloy; and
    the first ferromagnetic upper reference layer comprises a layer of Ni.

5. The TMR element of claim 1 wherein:
    the first ferromagnetic upper pinned reference layer comprises a layer of a Co alloy; and the first ferromagnetic upper reference layer comprises a layer of Co.

6. The TMR element of claim 1 wherein:
the first ferromagnetic upper pinned reference layer comprises a layer of an Fe alloy; and
the first ferromagnetic upper reference layer comprises a layer of Fe.

7. The TMR element of claim 1 wherein TMR element comprises a current perpendicular to the planes (CPP) element.

8. A magnetic disk drive system comprising:
a magnetic recording medium; and
a recording head adapted to read from the magnetic recording medium, the recording head including a dual-type tunneling magnetoresistance (TMR) element comprising:
  a lower pinned layer structure having a first Fermi level;
  a lower barrier layer;
  a free layer structure;
  an upper barrier layer; and
  an upper pinned layer structure having a second Fermi level that is different than the first Fermi level of the lower pinned layer structure;
  wherein the upper pinned layer structure includes:
    a first ferromagnetic upper pinned reference layer formed from an alloy;
    a first ferromagnetic upper reference layer formed from a pure metal;
    a second ferromagnetic upper pinned reference layer;
    a nonmagnetic spacer layer;
    a first ferromagnetic upper pinned keeper layer;
    a second upper reference layer; and
    a second ferromagnetic upper pinned keeper layer.

9. The magnetic disk drive system of claim 8 wherein:
the lower pinned layer structure includes:
  a ferromagnetic lower pinned keeper layer;
  a nonmagnetic lower spacer layer; and
  a ferromagnetic lower pinned reference layer.

10. The magnetic disk drive system of claim 9 wherein:
the first ferromagnetic upper pinned reference layer comprises a layer of a Ni alloy; and
the first ferromagnetic upper reference layer comprises a layer of Ni.

11. The magnetic disk drive system of claim 9 wherein:
the first ferromagnetic upper pinned reference layer comprises a layer of a Co alloy; and
the first ferromagnetic upper reference layer comprises a layer of Co.

12. The magnetic disk drive system of claim 9 wherein:
the first ferromagnetic upper pinned reference layer comprises a layer of an Fe alloy; and
the first ferromagnetic upper reference layer comprises a layer of Fe.

13. The magnetic disk drive system of claim 8 wherein the difference between the first Fermi energy of the lower pinned layer structure and the second Fermi energy of the upper pinned layer structure is at least 1 eV.

14. The magnetic disk drive system of claim 8 wherein TMR element comprises a current perpendicular to the planes (CPP) element.

15. A method of fabricating a tunneling magnetoresistance (TMR) element, the method comprising:
forming a lower pinned layer structure having a first Fermi level;
forming a lower barrier layer;
forming a free layer structure;
forming an upper barrier layer; and
forming an upper pinned layer structure having a second Fermi level different than the first Fermi level of the lower pinned layer structure;
wherein forming the upper pinned layer structure includes:
  forming a first ferromagnetic upper pinned reference layer from an alloy;
  forming a first ferromagnetic upper reference layer from a pure metal;
  forming a second ferromagnetic upper pinned reference layer;
  forming a nonmagnetic spacer layer;
  forming a first ferromagnetic upper pinned keeper layer;
  forming a second upper reference layer; and
  forming a second ferromagnetic upper pinned keeper layer.

16. The method of claim 15 wherein:
forming a lower pinned layer structure includes:
  forming a ferromagnetic lower pinned keeper layer;
  forming a nonmagnetic lower spacer layer; and
  forming a ferromagnetic lower pinned reference layer.

17. The method of 15 wherein the difference between the first Fermi energy of the lower pinned layer structure and the second Fermi energy of the upper pinned layer structure is at least 1 eV.

18. The method of claim 15 wherein:
forming a first ferromagnetic upper pinned reference layer includes forming a layer of a Ni alloy; and
forming a first ferromagnetic upper reference layer includes forming a layer of Ni.

19. The method of claim 15 wherein:
forming a first ferromagnetic upper pinned reference layer includes forming a layer of a Co alloy; and
forming a first ferromagnetic upper reference layer includes forming a layer of Co.

20. The method of claim 15 wherein:
forming a first ferromagnetic upper pinned reference layer includes forming a layer of an Fe alloy; and
forming a first ferromagnetic upper reference layer includes forming a layer of Fe.

* * * * *

UNITED STATES PATENT AND TRADEMARK OFFICE
CERTIFICATE OF CORRECTION

| | |
|---|---|
| PATENT NO. | : 7,633,724 B2 |
| APPLICATION NO. | : 11/395301 |
| DATED | : December 15, 2009 |
| INVENTOR(S) | : Hardayal S. Gill |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 848 days.

Signed and Sealed this

Ninth Day of November, 2010

David J. Kappos
*Director of the United States Patent and Trademark Office*